United States Patent
Yu et al.

(10) Patent No.: US 8,779,445 B2
(45) Date of Patent: Jul. 15, 2014

(54) STRESS-ALLEVIATION LAYER FOR LED STRUCTURES

(75) Inventors: Chen-Hua Yu, Hsin-Chu (TW);
Hung-Ta Lin, Hsin-Chu (TW);
Ding-Yuan Chen, Taichung (TW);
Wen-Chih Chiou, Miaoli (TW);
Chia-Lin Yu, Sigang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 808 days.

(21) Appl. No.: 12/179,160

(22) Filed: Jul. 24, 2008

(65) Prior Publication Data

US 2010/0001257 A1    Jan. 7, 2010

Related U.S. Application Data

(60) Provisional application No. 61/077,804, filed on Jul. 2, 2008.

(51) Int. Cl.
*H01L 29/18* (2006.01)

(52) U.S. Cl.
USPC ................. 257/88; 257/13; 257/E33.055

(58) Field of Classification Search
CPC ......... H01L 33/12; H01L 33/08; H01L 27/15; H01L 27/153; H01L 27/156
USPC ........................................ 257/13, 88, E33.055
See application file for complete search history.

(56) References Cited

U.S. PATENT DOCUMENTS

| | | | | |
|---|---|---|---|---|
| 4,555,301 A | * | 11/1985 | Gibson et al. ................... | 117/44 |
| 5,656,829 A | * | 8/1997 | Sakaguchi et al. .............. | 257/94 |
| 6,949,443 B2 | | 9/2005 | Ke et al. | |
| 7,394,136 B2 | | 7/2008 | Ke et al. | |
| 2002/0079498 A1 | * | 6/2002 | Koide ............................. | 257/79 |
| 2002/0179005 A1 | * | 12/2002 | Koike et al. ..................... | 117/84 |
| 2003/0102473 A1 | * | 6/2003 | Chason et al. .................. | 257/43 |
| 2005/0023550 A1 | * | 2/2005 | Eliashevich et al. ............ | 257/99 |

FOREIGN PATENT DOCUMENTS

CN    1607659 A    4/2005

* cited by examiner

*Primary Examiner* — Tucker Wright
(74) *Attorney, Agent, or Firm* — Slater and Matsil, L.L.P.

(57) ABSTRACT

A light emitting diodes (LEDs) is presented. The LED includes a stress-alleviation layer on a substrate. Open regions and stress-alleviation layer regions are formed on the substrate. Epitaxial layers are disposed on the substrate, at least in the open regions therein, thereby forming an LED structure. The substrate is diced through at least a first portion of the stress-alleviation regions, thereby forming the plurality of LEDs.

21 Claims, 8 Drawing Sheets

STRESS-ALLEVIATION LAYER FOR LED STRUCTURES

This application claims priority to U.S. Provisional Patent Application Ser. No. 61/077,804, filed Jul. 2, 2008, and entitled "Stress-Alleviation Layer for LED Structures," which application is hereby incorporated herein by reference.

TECHNICAL FIELD

The present invention relates generally to a light emitting diode (LED), a method of manufacturing LEDs, a multiple LED structure, and more particularly to an LED that includes a stress-alleviation layer, which reduces residual stress and avoids stress damage during epitaxial growth and dicing processes.

BACKGROUND

Light emitting diodes (LEDs) are manufactured by forming active regions on a substrate and by depositing various conductive and semiconductive layers on the substrate. The radiative recombination of electron-hole pairs can be used for the generation of electromagnetic radiation by the electric current in a p-n junction. In a forward-biased p-n junction fabricated from a direct band gap material, such as GaAs or GaN, the recombination of the electron-hole pairs injected into the depletion region causes the emission of electromagnetic radiation. The electromagnetic radiation may be in the visible range or may be in a non-visible range. Different colors of LEDs may be created by using materials with different band gaps. Further, an LED with electromagnetic radiation emitting in a non-visible range may direct the non-visible light towards a phosphor lens or a like material type. When the non-visible light is absorbed by the phosphor, the phosphor emits a visible light.

LEDs are typically manufactured on a substrate such as a sapphire ($Al_2O_3$) wafer. However, growing a GaN film on a sapphire substrate often results in crystal defects and cracks, due to the significant differences in the thermal expansion rate and the lattice constant between the GaN film and the substrate.

Multiple LEDs are typically formed on a single sapphire substrate and then diced or separated from each other. Often the dicing process includes a laser process and polishing. Unfortunately, the process of dicing the wafers to free individual LEDs may expose the LEDs to stress that may be harmful to the LED structures. The LEDs exposed to stress may crack, break, or manifest other damage.

SUMMARY OF THE INVENTION

These and other problems are generally solved or circumvented, and technical advantages are generally achieved by a light emitting diodes (LEDs), and more particularly, an LED that includes a stress-alleviation layer that reduces residual stress and avoids stress damage during epitaxial growth and the dicing processes.

In accordance with an illustrative embodiment, a method of manufacturing a plurality of light emitting diodes (LEDs) is presented. The method includes disposing a stress-alleviation layer on a substrate. Open regions and stress-alleviation layer regions are formed on the substrate. Heteroepitaxial layers are disposed on the substrate at least in the open regions therein, forming an LED structure. The substrate is diced through at least a first portion of the stress-alleviation regions, thereby forming the plurality of LEDs.

Advantages of an illustrative embodiment of the present invention include providing a scheme to partition off LED chips to avoid stress damage in the LED structure. Another advantage of an embodiment is the inclusion of stress-alleviation regions, or islands, within the LED structure to reduce residual stress during heteroepitaxial growth of the LED structure. A further advantage of an illustrative embodiment is that selective epitaxy may be used, thereby potentially lowering the cost and complexity of the process. Yet another advantage is that in an illustrative embodiment, a reflective buffer layer, or an additional reflective layer, may be used, thereby increasing the light power emitted from the non-reflective side of the LED.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to use the inventive method, and do not limit the scope of the invention.

The present invention will be described with respect to illustrative embodiments in a specific context, namely a semiconductor LED. The invention may also be applied, however, to other semiconductor devices With reference now to FIG. 1, there is shown a cross-sectional view of a separated LED in accordance with an illustrative embodiment. LED 100 is shown with substrate 102. Substrate 102 may comprise silicon. Substrate 102 may or may not be doped. Stress-alleviation layer regions 104 may be comprised of $SiO_2$, SiN, III-Nitrides, or combinations thereof. Preferably, stress-alleviation layer regions 104 are comprised of $SiO_2$ deposited in a chemical vapor deposition (CVD) chamber. Stress-alleviation layer regions 104 may have a thickness in the range of about 0.1-about 5.0 μm. On substrate 102, between stress-alleviation layer regions 104, is LED structure 101, formed from multiple layers, which is epitaxially grown. LED structure 101 is formed on substrate 102.

Epitaxial films are ordered crystalline growth layers formed on a monocrystalline substrate or layer. Epitaxial films may be grown from gaseous or liquid precursors. Because the substrate or layer acts as a seed crystal, the epitaxially grown film takes on the lattice structure and orientation of the substrate. Heteroepitaxial growth is the process of depositing an epitaxial layer on a substrate of a different composition.

Figure 1:
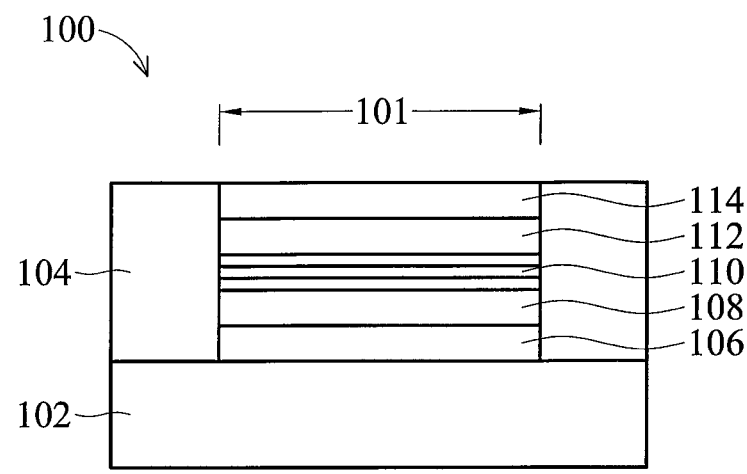
FIG. 1 is a cross-sectional view of a separated LED in accordance with an illustrative embodiment.

In the embodiment shown in FIG. 1, a selective epitaxial process is used. Selective epitaxy grows over a monocrystalline structure; therefore, the epitaxial layer does not grow on the stress-alleviation layer. Thus, LED structure 101 is formed selectively over substrate 102.

Buffer layer 106 is disposed on substrate 102. Buffer layer 106 may be comprised of AlN, TiN, or other metal nitride, and may be in the thickness range of about 200-400 Å. AlN, for example, has a hexagonal crystal structure and a large band gap and may be disposed by a molecular-beam epitaxy (MBE), metal organic chemical vapor deposition (MOCVD), hydride vapor phase epitaxy (HVPE), or liquid phase epitaxy (LPE) process.

In MBE, a source material is heated to produce an evaporated beam of particles. The beam of particles is deposited in a high vacuum ($10^{-8}$ Pa), where the beam of particles condenses into a layer. In a MOCVD process, the formation of the epitaxial layer occurs by final pyrolysis of the constituent chemicals at the substrate surface. In contrast to MBE, the growth of crystals in a MOCVD process is by chemical reaction and not physical deposition. HVPE is an epitaxial growth technique, which may use carrier gases such as ammonia, hydrogen and various chlorides. LPE is a method to grow crystal layers from the melt on solid substrates.

Figure 8A:
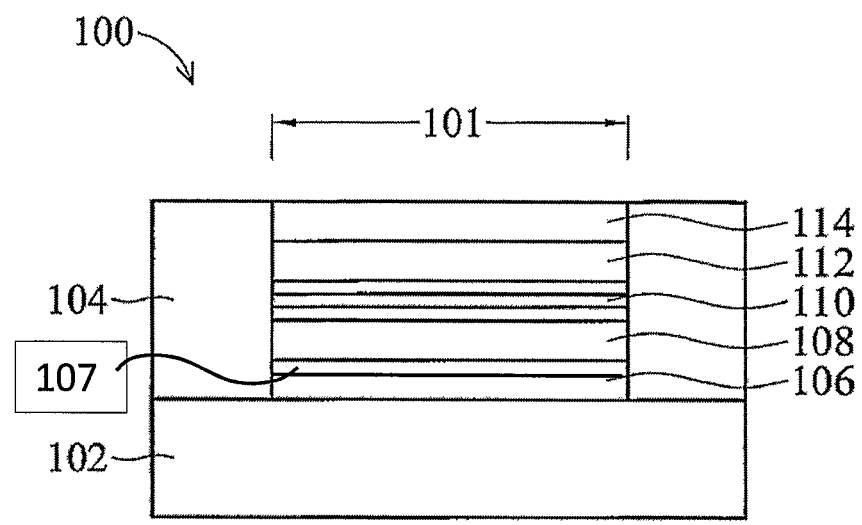
FIGS. 8A and 8B illustrate alternative embodiments incorporating a reflectivity layer.
Figure 8B:
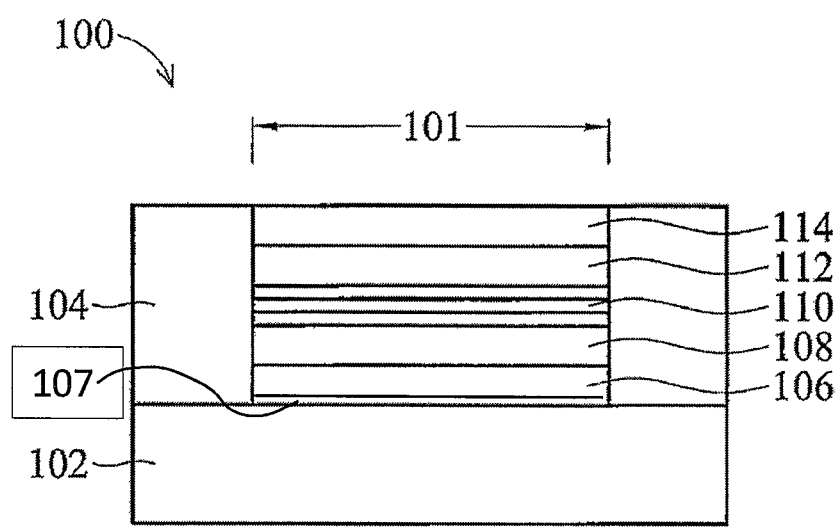

In an embodiment, a reflective layer may be added to LED 100. The layer may be added either on or under buffer layer 106 (as shown in FIGS. 8A and 8B, respectively). The material itself may be reflective, and an additional reflective layer or a distributed Bragg reflector (DBR) may or may not be included in addition to, or instead of, a reflective layer. The DBR may be comprised of alternating layers of materials with differing diffraction indexes or the like. When a reflective layer is added, LED 100 is a top emitting LED and the power output from the top-side may be greater than an illustrative embodiment in which no reflective layer is added.

In any case, first contact epitaxial layer 108 is disposed on buffer layer 106. First contact epitaxial layer 108 may be in the range of about 1.0-about 4.0 μm thick. An example material for first contact epitaxial layer 108 is GaN:Si disposed by a MOCVD, MBE, HVPE, or LPE process.

Active layer 110 is disposed on first contact epitaxial layer 108. Active layer 110 may comprise multiple quantum wells (MQW)(not shown). MQW structures in active layer 110 may be layers of InGaN and GaN, for example. There may be 3 or 5 QWs, for example, wherein each is about 30 Å (InGaN)/100 Å (GaN) thick. MQWs in active layer 110 may be disposed in an epitaxial reactor (not shown). Second contact epitaxial layer 112 is disposed on active layer 110. Second contact epitaxial layer 112 may be grown in an epitaxial reactor (not shown) to about 0.3 μm thick and comprise GaN:Mg, or the like.

Top-side contact 114 is disposed on top of second contact epitaxial layer 112. Example methods to contact the emission face of the LED may include the use of a transparent conductive material, such as indium tin oxide (ITO). Further, a metal pad may be attached to the ITO coating. Top-side contact 114 may be comprised of Ni, Au, ITO, combinations thereof, or the like, at a thickness of about 5.0-about 15.0 nm, for example. Top-side contact 114 may be disposed onto LED 100 in a sputtering, E-beam process or the like.

Figure 2:
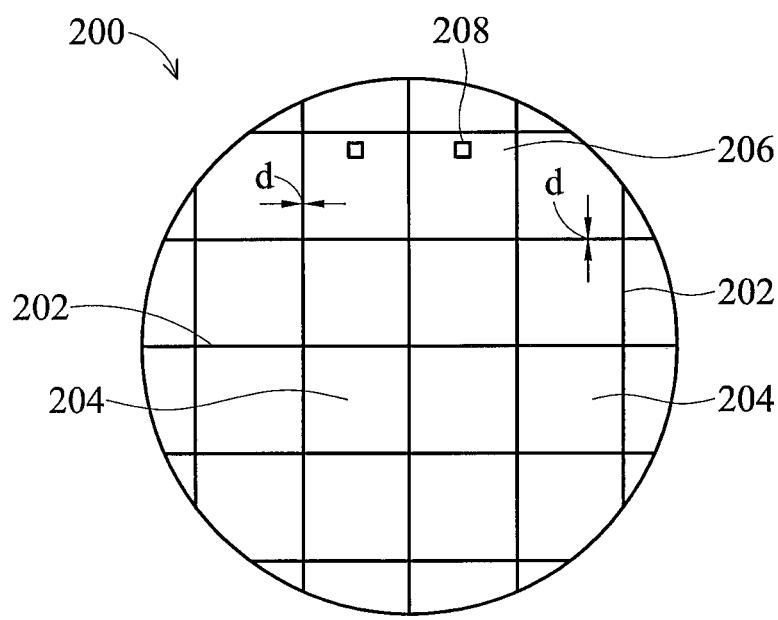
FIG. 2 shows a top view of a wafer with selected stress-alleviation regions indicated.

FIG. 2 shows a top view of a wafer with selected stress-alleviating regions in a grid on a substrate, such as substrate 102 in FIG. 1. Hereafter, the term "work piece" generally refers to a substrate including various layers and structures formed thereon. Work piece 200 may comprise a Si wafer with layers such as those described in FIG. 1, for example. A single wafer is typically used for the fabrication of a number of dice, or individual portions of the wafer that will eventually be cut apart from each other and used separately (in this example, LEDs). Typically, all of the dice on a single wafer are formed identically, but this is not necessarily the case in an illustrative embodiment. Stress-alleviation regions 202 are depicted by lines on work piece 200. The stress-alleviation layer distance "d" between LEDs may be between about 10-50 μm. LEDs 204 are bordered by stress-alleviation regions 202 in this embodiment. LEDs 204 may range in size and may be, for example, between 100 μm by 100 μm and 10 mm by 10 mm. In other embodiments, however, stress-alleviation islands 208 may be found within LEDs 206. Stress-alleviation islands are stress-alleviation regions termed "stress-alleviation islands" to more clearly describe their locations internal to LEDs 206. Stress-alleviation islands 208 may be of any shape and size and may be formed in LEDs 206 to relieve residual stresses internal to LEDs 206, as well as a countermeasure for the stress damage experienced during a dicing process. Stress-alleviation regions 202 and stress-alleviation islands 208 may be uniform across the wafer, or may vary in LEDs across the wafer to more effectively counter the stresses during epitaxial growth and the dicing process (compare LED 204 and LED 206).

Figure 3A:
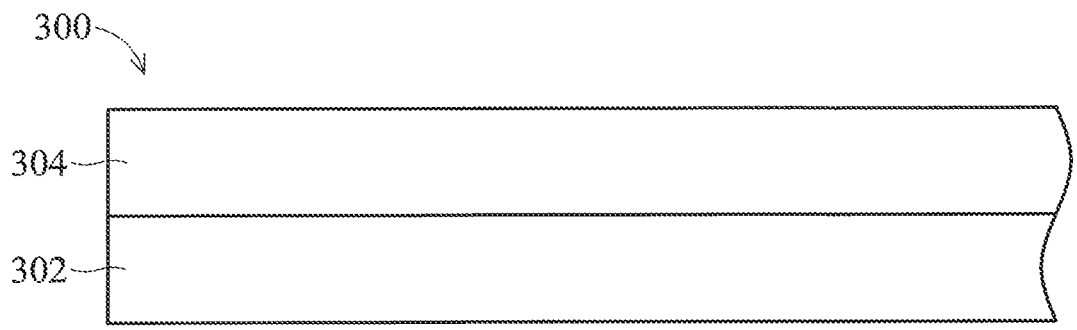
FIGS. 3A-3D show selected process steps in a method of manufacturing LEDs, in accordance with an illustrative embodiment.

Turning now to FIGS. 3A-3D, selected cross-sectional views of intermediate processing steps are shown for an illustrative embodiment. FIG. 3A shows work piece 300, including substrate 302, with stress-alleviation layer 304 disposed on the surface of substrate 302. Substrate 302 may comprise silicon or other materials. Substrate 302 may be doped or undoped, and an N or P type wafer. Further, substrate 302 may comprise a wafer, with a top layer comprising Si. Substrate 302 may include other conductive layers or other semiconductor elements, for example, transistors, diodes, etc. Compound semiconductors, GaAs, InP, Si/Ge, or SiC, as examples, may be used in place of silicon. Substrate 302 in the embodiment illustrated in FIGS. 3A-3D is N type Si.

Stress-alleviation layer 304 may or may not be blanket deposited on substrate 302. In the illustrative embodiment shown, stress-alleviation layer 304 is $SiO_2$ and is blanket deposited on substrate 302 using a chemical vapor deposition (CVD) process.

Figure 3B:
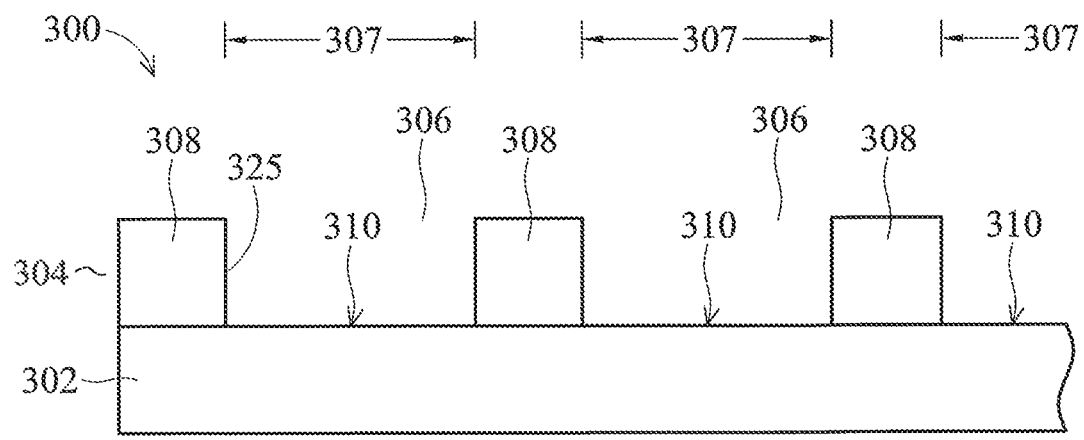

FIG. 3B shows the resulting cross-sectional view of work piece 300 after stress-alleviation layer 304 has been removed in LED structure areas 307 leaving stripes, islands or other shapes of stress-alleviation regions 308 or islands (not shown) on substrate 302. Stress-alleviation layer 304 may be opened by a photolithography process (not shown) followed by an etch process (not shown). In photolithography, photoresist is deposited and spread evenly over the wafer surface, in this embodiment stress-alleviation layer 304. The photo resist is then selectively treated with a light source directed through a patterned mask (not shown) so that some portions of the photo resist are exposed to the light energy and others are not. The exposed portions of the photoresist are either strengthened or weakened, depending on the type of photo resist material used, so that the weaker portions can be washed away using a solvent (not shown), or in a reactor (not shown) that will not otherwise affect the wafer or any structures already formed on it. The photoresist that remains, however, will prevent the etching of the wafer surface in the covered areas when the etching agent (not shown) is used in subsequent steps. When the desired wafer etching has been accomplished, the remaining photoresist is removed using an appropriate solvent, or ashed in a reactor.

Alternatively, stress-alleviation layer 304 may be directly patterned using electron beam lithography (EBL), as an example. In a further alternative, the use of a photoresist is not required to pattern stress-alleviation layer 304 that is comprised of a photosensitive insulating or dielectric material. Rather, the photosensitive insulating material is directly patterned using a lithography mask having transparent areas and opaque areas, followed by the appropriate removal of the layer from the desired open areas.

Looking again at FIG. 3B, one can see stress-alleviation regions 308, which are formed from stress-alleviation layer 304, in addition to LED structure areas 307. Open areas 306 have a bottom surface 310 comprising a top surface of substrate 302. In this embodiment bottom surfaces 310 are comprised of Si. Sidewalls 325 of open areas 306 may comprise stress-alleviation regions 308. Open areas 306 are the areas in which LED structures will subsequently be formed.

Figure 3C:
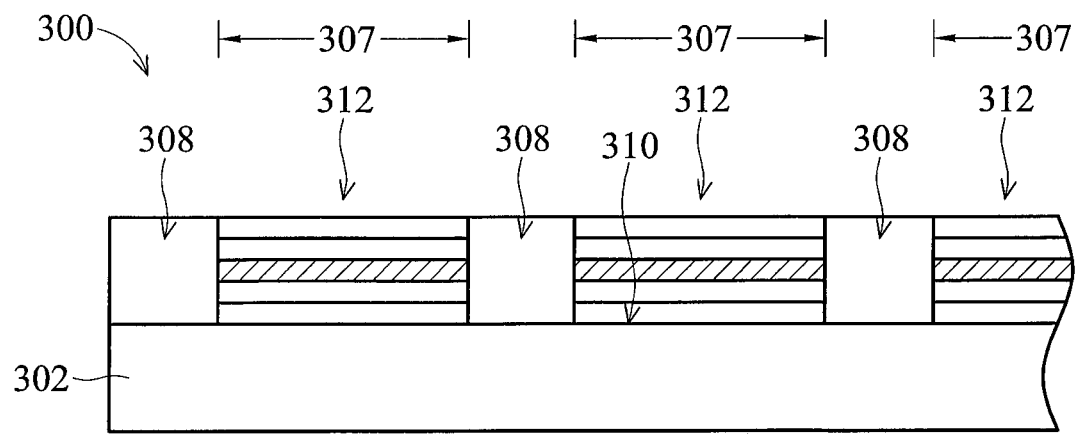

Turning to FIG. 3C, a resultant work piece 300 is shown following LED structure creation. Work piece 300 shows stress-alleviation regions 308 and LED structures 312 formed in LED structure areas 307. LED structure areas 307 are the same as open areas 306 of FIG. 3B. LED structures 312 may be comprised of layers such as the layers described in FIG. 1, or the like.

Implementing Si for substrate 302 or a top surface 310 of substrate 302 is advantageous in that it provides a Si surface in which a buffer layer, such as buffer layer 106 in FIG. 1, may be epitaxially grown. Stress-alleviation regions 308, and further stress-alleviation islands (not shown), may mitigate some of the crystal defects, cracking, and residual stresses internal to LED structures 312 during an epitaxial growth process.

Figure 3D:
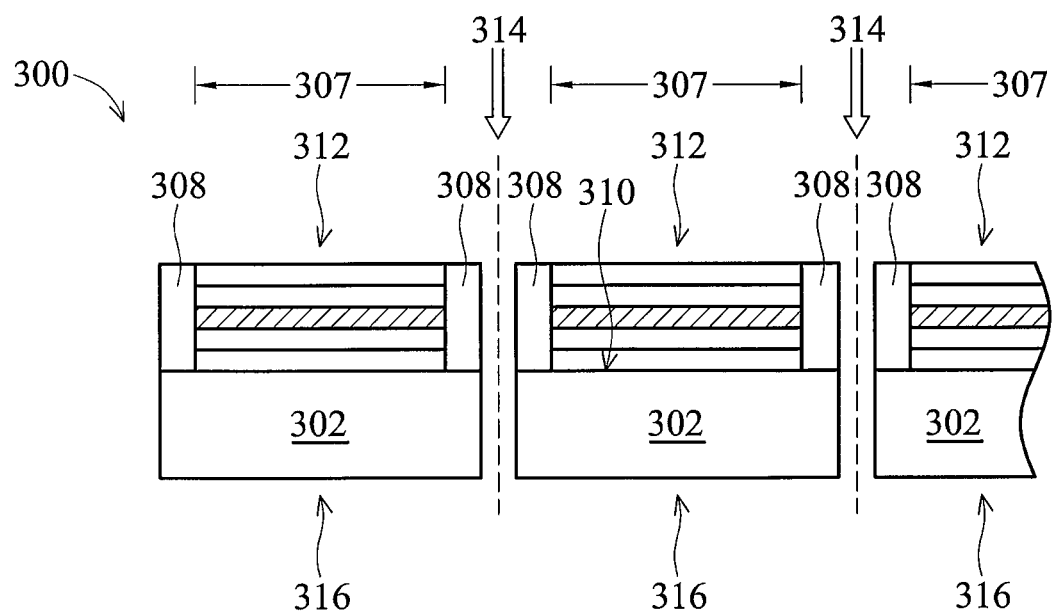

Turning now to FIG. 3D, separate LEDs are shown. FIG. 3D shows a resultant cross-sectional view of separated work piece 300. Work piece 300 is separated by dicing process 314. Dicing process 314 may be a mechanical sawing process, a laser process, an etching process, or any other appropriate process to separate the LED die into separate LEDs 316. Dicing through stress-alleviation regions 308 mitigates some of the damaging stress effects of the dicing process. Note from FIG. 3D that areas of stress-alleviation regions 308 may remain on the separate LEDs 316.

Figure 4A:
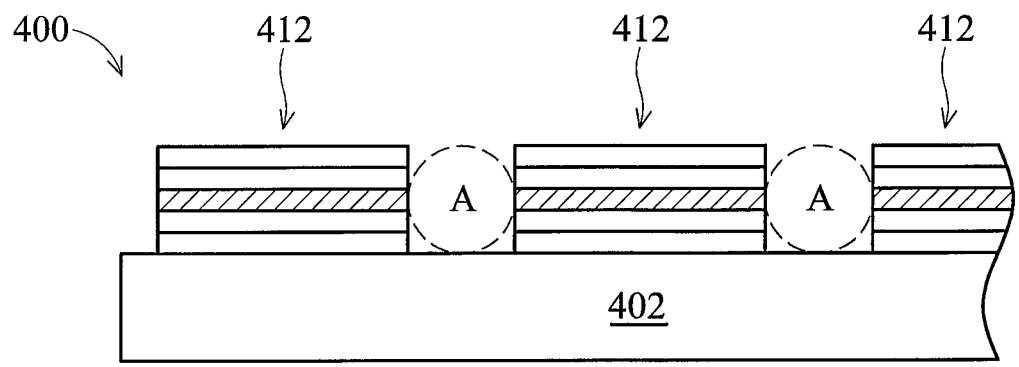
FIG. 4A illustrates an optional process step with a stress-alleviation layer removed before dicing and FIG. 4B illustrates the resultant separated LEDs following the dicing process.
Figure 4B:
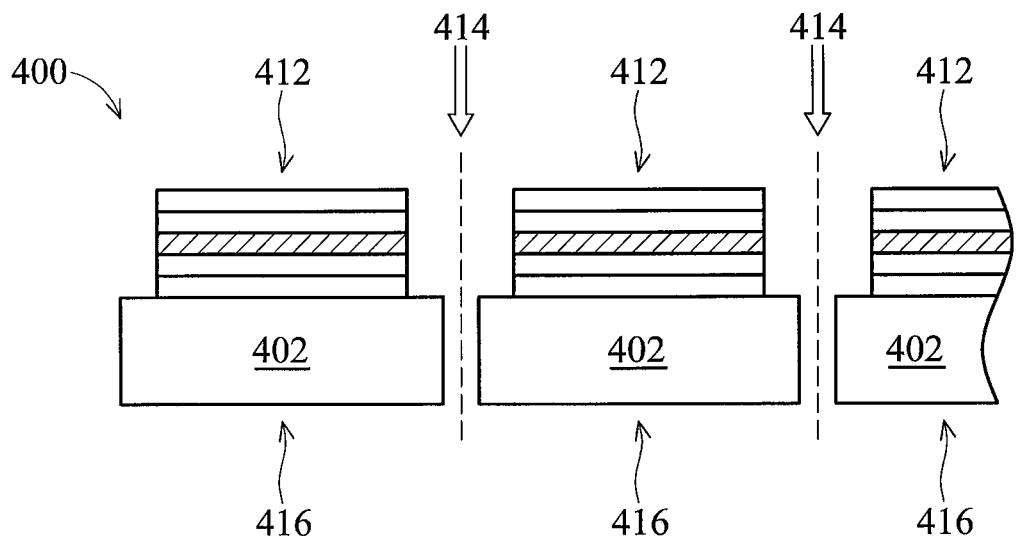

FIG. 4A illustrates another illustrative embodiment. FIG. 4A shows work piece 400, wherein a stress-alleviation layer, such as stress-alleviation layer 304 in FIG. 3B, is removed (see area A) following the formation of LED structures 412 on substrate 402. Stress-alleviation layers may be removed by an RIE etch, a Boshe etch or the like. FIG. 4B shows work piece 400 divided into separate LEDs 416 following dicing process 414. Any stress-alleviation islands that may be formed in an LED may or may not be removed during the removal step in this embodiment.

Figure 5A:
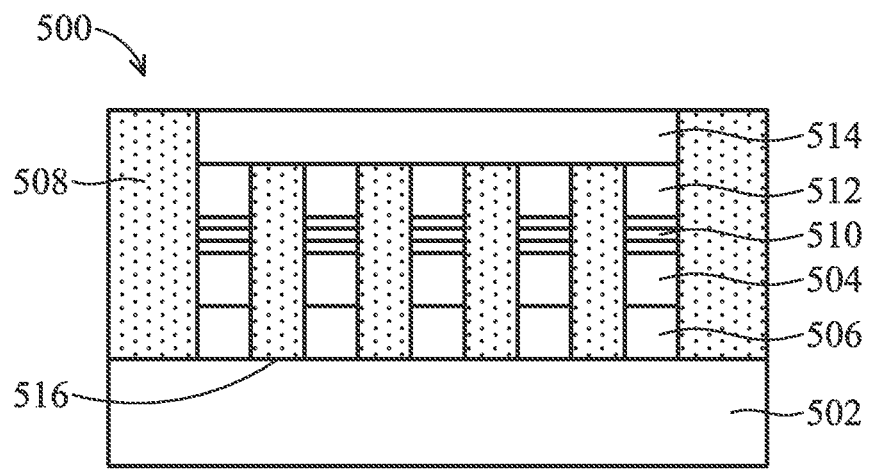
FIGS. 5A and 5B show a side view and a top view, respectively, of an LED with a thick-layer stress-alleviation island distributed within the LED.
Figure 5B:
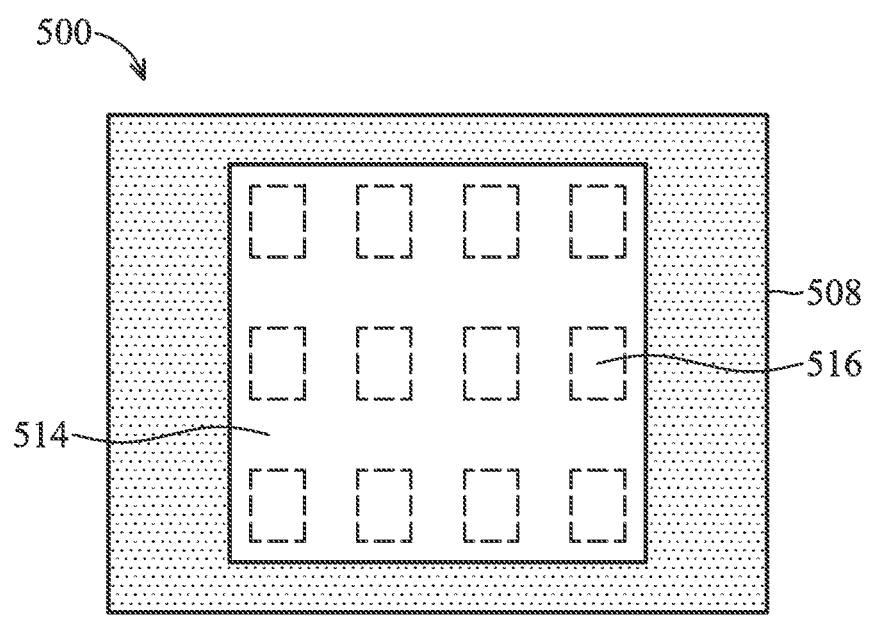

FIGS. 5A and 5B show a side view and a top view, respectively, of an LED with thick-layer stress-alleviation islands 516 distributed within an LED 500. FIG. 5A shows a cross-sectional view of LED 500. Stress-alleviation regions 508 are the areas through which the dicing process diced through in the process of separating LED 500. Stress-alleviation islands 516 are an example of stress-alleviation islands that may be disposed on substrate 502 and incorporated into LED 500. Stress alleviation islands 516 may be comprised of a stress-alleviation layer, such as stress-alleviation layer 304 in FIG. 3B. Other layers of LED 500 may be similar to those discussed above with reference to FIG. 1. For example, substrate 502 may comprise silicon. Stress-alleviation regions 508 and stress-alleviation islands 516 may be comprised of $SiO_2$, SiN, III-Nitrides, or combinations thereof. Buffer layer 506 may be disposed directly on substrate 502. First contact epitaxial layer 504 is disposed on buffer layer 506. Active layer 510 is disposed on first contact epitaxial layer 504. Active layer 510 may comprise MQWs. Second contact epitaxial layer 512 is disposed on active layer 510. Top-side contact 514 is disposed on top of second contact epitaxial layer 512 and on top of stress-alleviation islands 516.

Turning to FIG. 5B a top side view of separated LED 500 is shown. Top contact layer 514 and stress-alleviation region 508 may be seen. Stress-alleviation islands 516 may be seen through top-side contact 514 (dotted areas). Note that stress-alleviation islands 516 do not span LED 500, thus LED 500 remains functional. Though not illustrated here, stress-alleviation islands 516 may be any size and any shape, such as square, rectangular, oval, round or the like, within the scope of these embodiments. Furthermore, the number of stress-alleviation islands 516 may vary.

Figure 6A:
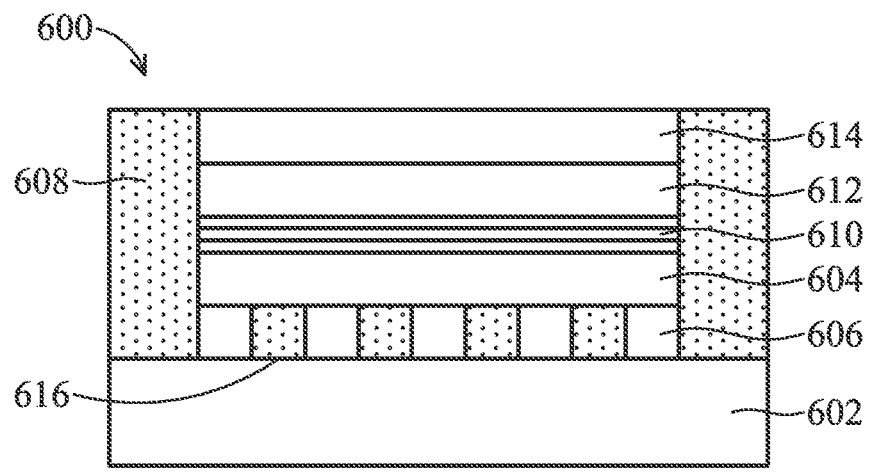
FIGS. 6A and 6B show a side view and a top view, respectively, of an LED with a thing-layer stress-alleviation island distributed with the LED.
Figure 6B:
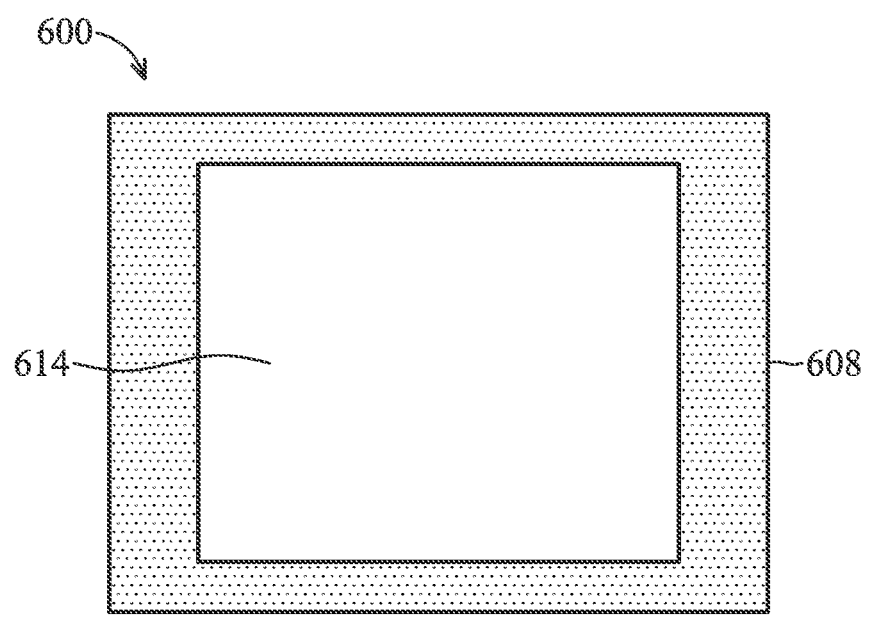

FIGS. 6A and 6B show a side view and a top view, respectively, of LED 600 with a thin-layer stress-alleviation islands 616 distributed within LED 600. FIG. 6A shows LED 600 with layers that are similar to those of FIG. 5A. For example, substrate 602 may comprise silicon. Stress-alleviation regions 608 and stress-alleviation islands 616 may be comprised of $SiO_2$, SiN, III-Nitrides, or combinations thereof. Buffer layer 606 may be disposed directly on substrate 602. First contact epitaxial layer 604 is disposed on buffer layer 606. Active layer 610 is disposed on first contact epitaxial layer 604. Active layer 610 may comprise MQWs. Second contact epitaxial layer 612 is disposed on active layer 610. Top-side contact 614 is disposed on top of second contact epitaxial layer 612.

Thin-layer stress-alleviation islands 616 however, are thinner than stress-alleviation islands 516 of FIG. 5A. Thin-layer stress-alleviation islands 616 may be the same thickness as buffer layer 606, rather than extending through all the layers including top-side contact 514 as shown in FIGS. 5A and 5B. Furthermore, thin-layer stress-alleviation islands 616 may be higher than buffer layer 606. Epitaxial lateral overgrowth (ELOG) can be performed to grow heteroepitaxial LED structures.

Though not illustrated here, thin-layer stress-alleviation islands 616 may be any size and any shape, such as square, rectangular, oval, round or the like, within the scope of these embodiments. Furthermore, the number of thin-layer stress-alleviation islands 616 may vary. Turning to FIG. 6B, a top view of LED 600 shows only top-side contact 614, wherein thin-layer stress-alleviation islands 616 are obscured by the layers above stress-alleviation islands 616.

Figure 7:
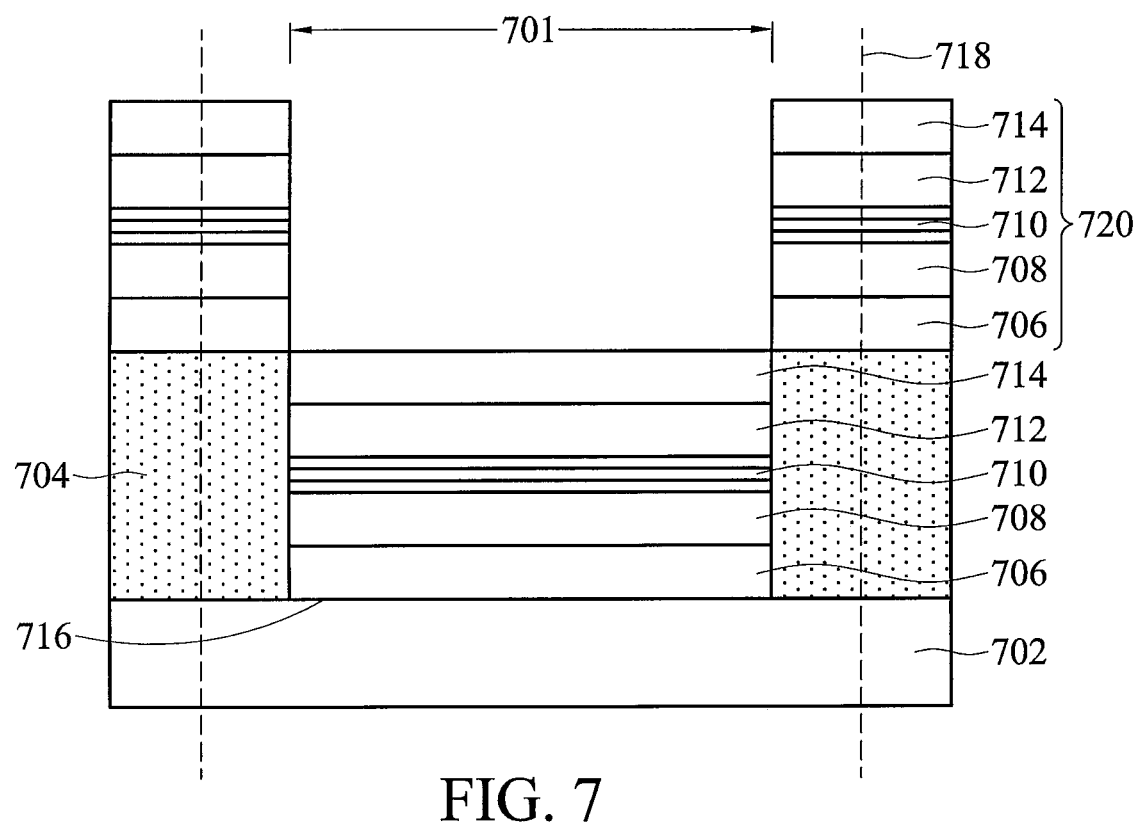
FIG. 7 shows a cross-sectional view of a non-selective epitaxial LED structure before dicing.

FIG. 7 is a cross-sectional view of another illustrative embodiment including a non-selective epitaxial LED structure, shown before dicing. In the embodiment shown in FIG. 7, non-selective epitaxy is used. Non-selective epitaxy grows over both a monocrystalline structure and a non-crystalline structure; therefore, an epitaxial layer can be formed on the stress-alleviation layer 704 as well as substrate 702. Thus, LED structure 701 is formed over substrate 702. However, non-functioning epitaxial layers 720 are formed over stress-alleviation layer 704. Non-selective epitaxial growth may be preceded by a precursor coating 716 to seed the epitaxial growth of the subsequent epitaxial layer or by using non-selective stress-alleviation layer 704. Dicing 718 is accomplished by cleaving through non-functional epitaxial layers 720 that are deposited over the stress-alleviation layer 704. The separated LED is functional in LED structure 701. The resulting LED may or may not be planarized before further processing.

Other layers correspond to those in FIG. 1 and therefore will not be discussed again here. For example, substrate 702 may comprise silicon. Stress-alleviation layer 704 may be comprised of $SiO_2$, SiN, III-Nitrides, or combinations thereof. Buffer layer 706 may be disposed directly on substrate 702. First contact epitaxial layer 708 is disposed on buffer layer 706. Active layer 710 is disposed on first contact epitaxial layer 708. Active layer 710 may comprise MQWs. Second contact epitaxial layer 712 is disposed on active layer 710. Top-side contact 714 is disposed on top of second contact epitaxial layer 712.

Although the illustrative embodiment and its advantages have been described in detail, it should be understood that various changes, substitutions, and alterations can be made herein without departing from the spirit and scope of the invention as defined by the appended claims. For example, it will be readily understood by those skilled in the art that other forms of semiconductor devices may benefit from the illustrative embodiments, including LEDs with additional circuitry and components not including LEDs, while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, the structure comprising:
   a dice comprising:
   a substrate;
   a non-crystalline stress-alleviation layer on the substrate;
   open regions and a first stress-alleviation region on the substrate, the first stress-alleviation region being a part of the non-crystalline stress-alleviation layer and forming a ring-like structure along the periphery of the dice, the first stress-alleviation region surrounding all of the open regions on the dice, and the first stress-alleviation region not contacting another part of the non-crystalline stress-alleviation layer; and
   epitaxial layers on the substrate, at least in the open regions, forming light emitting diode (LED) structures therein, the LED structures having bottom surfaces proximate the substrate and top surfaces distal the substrate, the non-crystalline stress-alleviation layer having a top surface substantially coplanar with the top surfaces of the LED structures.

2. The structure of claim 1, wherein the substrate is selected from the group consisting of Si, sapphire, SiC and GaN.

3. The structure of claim 1, wherein the non-crystalline stress-alleviation layer is selected from the group consisting of $SiO_2$, SiN, III-Nitrides, or combinations thereof.

4. The structure of claim 1, wherein the epitaxial layers comprise at least one selective epitaxy layer.

5. The structure of claim 1 further comprising:
   a precursor underlying the epitaxial layers.

6. The structure of claim 5, wherein the epitaxial layers comprise an at least one non-selective epitaxial layer.

7. The structure of claim 1, wherein the non-crystalline stress-alleviation layer is interposed between the substrate and an epitaxial layer.

8. The structure of claim 1, wherein the non-crystalline stress-alleviation layer is interposed between two epitaxial layers.

9. The structure of claim 1, further comprising a second stress-alleviation region on the substrate, the second stress-alleviation region being a part of the non-crystalline stress-alleviation layer and comprising at least one stress-alleviation island.

10. The structure of claim 1 further comprising:
    a reflectivity layer added to the LED structures.

11. A semiconductor structure, the structure comprising:
    a substrate having a major surface;
    a plurality of non-crystalline, non-continuous stress-alleviation regions formed on the substrate, the plurality of stress-alleviation regions having bottom surfaces proximate the substrate and top surfaces distal the substrate; and
    a plurality of light emitting diode (LED) structures formed on the substrate, wherein at least two of the plurality of LED structures comprise a stack of layers having substantially coterminous sidewalls, each of the substantially coterminous sidewalls contacting an at least one stress-alleviation region and extending from the substrate to the top surface of the at least one stress-alleviation region.

12. The semiconductor structure of claim 11, wherein a first portion of the plurality of non-crystalline, non-continuous stress-alleviation regions comprises a stress-alleviation layer on the substrate, and wherein a second portion of the plurality of non-crystalline, non-continuous stress-alleviation regions comprises regions open to the substrate.

13. The semiconductor structure of claim 11, wherein the plurality of LED structures border a plurality of stress-alleviation regions.

14. The semiconductor structure of claim 11, wherein a portion of the plurality of LED structures includes a stress-alleviation island, wherein the stress-alleviation island is comprised of a stress-alleviation region within an LED structure.

15. The semiconductor structure of claim 11, wherein the stack of layers comprises a top-side contact layer, the top-side contact layer having a surface substantially coplanar with the top surface of the at least one stress-alleviation layer.

16. A light emitting diode (LED) comprising:
   a substrate;
   stress-alleviation regions, at least one stress-alleviation region comprising a non-crystalline region, surrounded on all sides by an LED structure and physically separated from any other stress-alleviation region;
   the LED structure comprising:
      a buffer layer disposed on the substrate;
      a quantum-well layer; and
      a top-side contact, wherein a first contact epitaxial layer is interposed between the buffer layer and the quantum-well layer, and wherein a second contact epitaxial layer is interposed between the quantum-well layer and the top-side contact, and wherein an at least one of the stress-alleviation regions borders the LED structure.

17. The LED of claim 16, wherein an at least one of the stress-alleviation regions forms a ring-like structure surrounding a periphery of the substrate.

18. The LED of claim 16, wherein the stress-alleviation regions are disposed between the substrate and an epitaxial layer.

19. The LED of claim 16, wherein the stress-alleviation regions are disposed between two epitaxial layers.

20. The LED of claim 16, wherein the stress-alleviation regions have a thickness between about 0.1-5.0 μm.

21. The LED of claim 16 further comprising:
   a reflectivity layer added to the LED structure.

* * * * *